United States Patent
Tsushima et al.

(10) Patent No.: US 8,213,214 B2
(45) Date of Patent: Jul. 3, 2012

(54) STORAGE DEVICE AND INFORMATION RERECORDING METHOD

(75) Inventors: Tomohito Tsushima, Tokyo (JP);
Tsunenori Shiimoto, Kanagawa (JP);
Shuichiro Yasuda, Kanagawa (JP)

(73) Assignee: Sony Corporation, Tokyo (JP)

( * ) Notice: Subject to any disclaimer, the term of this patent is extended or adjusted under 35 U.S.C. 154(b) by 208 days.

(21) Appl. No.: 12/747,413

(22) PCT Filed: Dec. 11, 2008

(86) PCT No.: PCT/JP2008/072489
§ 371 (c)(1),
(2), (4) Date: Jun. 10, 2010

(87) PCT Pub. No.: WO2009/075316
PCT Pub. Date: Jun. 18, 2009

(65) Prior Publication Data
US 2010/0259968 A1    Oct. 14, 2010

(30) Foreign Application Priority Data
Dec. 12, 2007   (JP) ................. P2007-320579

(51) Int. Cl.
*G11C 11/00* (2006.01)

(52) U.S. Cl. ................. 365/148; 365/100

(58) Field of Classification Search ............ 365/148, 365/100, 163
See application file for complete search history.

(56) References Cited

U.S. PATENT DOCUMENTS

| | | | |
|---|---|---|---|
| 2004/0264244 A1* | 12/2004 | Morimoto | 365/180 |
| 2005/0174840 A1 | 8/2005 | Tsushima et al. | |
| 2006/0274564 A1* | 12/2006 | Kim | 365/100 |
| 2006/0279983 A1* | 12/2006 | Hachino et al. | 365/158 |
| 2007/0008770 A1 | 1/2007 | Nagao et al. | |

FOREIGN PATENT DOCUMENTS

| | | |
|---|---|---|
| JP | 11-110977 | 4/1999 |
| JP | 2005-235360 | 9/2005 |
| JP | 2007-018615 | 1/2007 |

OTHER PUBLICATIONS

International Search Report dated Mar. 6, 2009, for corresponding Patent Application PCT/JP2008/072489.
Nikkei Electronics Jul. 16, 2007.

* cited by examiner

*Primary Examiner* — Anh Phung
(74) *Attorney, Agent, or Firm* — K&L Gates LLP (57) ABSTRACT

A storage device that improves ability of adjusting a resistance value level in recording and enables stable verification control is provided. VWL supplied from a second power source to a control terminal of a transistor is increased (increase portion: $\Delta$VWL) for every rerecording by verification control by a WL adjustment circuit. In the case where a variable resistive element is able to record multiple values, $\Delta$VWL is a value variable for every resistance value level of multiple value information. That is, $\Delta$VWL is a value variable according to magnitude relation of a variation range of recording resistance of the variable resistive element due to a current. In the region where the variation range of the recording resistance is large (source-gate voltage VGS of the transistor is small), $\Delta$VWL is small, while in the region where the variation range of the recording resistance is small (VGS is large), $\Delta$VWL is large.

18 Claims, 9 Drawing Sheets

STORAGE DEVICE AND INFORMATION RERECORDING METHOD

CROSS REFERENCE TO RELATED APPLICATIONS

The present application is a National Stage of International Application No. PCT/JP2008/072489 filed on Dec. 11, 2008 and which claims priority to Japanese Patent Application No. 2007-320579 filed on Dec. 12, 2007, the entire contents of which are being incorporated herein by reference.

BACKGROUND

The present disclosure relates to a storage device that includes a memory cell having a storage element and a switching element, and particularly to a storage device and an information rerecording method for rerecording by verification control.

In information equipments such as a computer, a high density DRAM (Dynamic Random Access Memory) capable of high speed operation is widely used. However, in the DRAM, there is a problem that the manufacturing cost is high, since the manufacturing process is more complicated than that of a general logical circuit, a general signal processing circuit or the like used for electronic devices. Further, since the DRAM is a volatile memory in which information is not retained if the power is turned off, it is necessary to perform refresh operation frequently.

Thus, as a nonvolatile memory in which information is retained even if the power is turned off, for example, an FeRAM (Ferroelectric Random Access Memory), MRAM (Magnetoresistive Random Access Memory) and the like have been proposed. In these memories, even if power is not supplied, written information is able to be retained for a long time. In addition, in these memories, it is not necessary to perform refresh operation, and thus power consumption is able to be decreased by just that much. However, there is a problem that miniaturization is not easy in the FeRAM, while there is a problem that a writing current is large in the MRAM (for example, Nonpatent Document 1).

Figure 15:
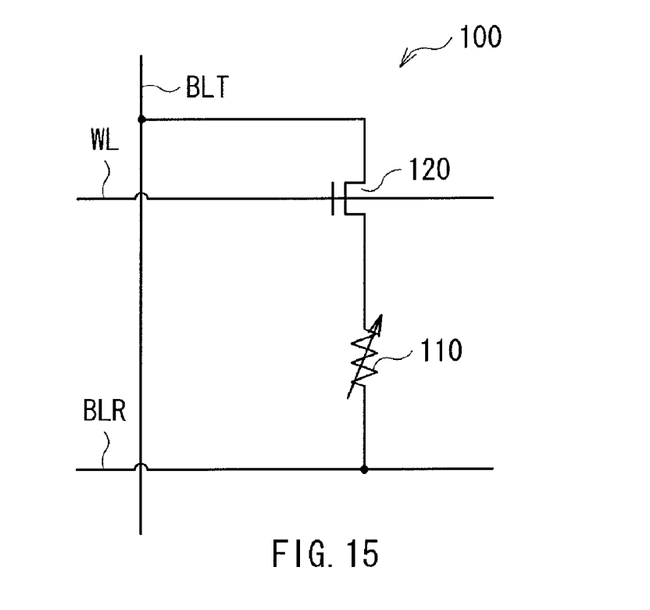
FIG. 15 is a circuit structural diagram of an existing storage device (memory cell).
Figure 16:
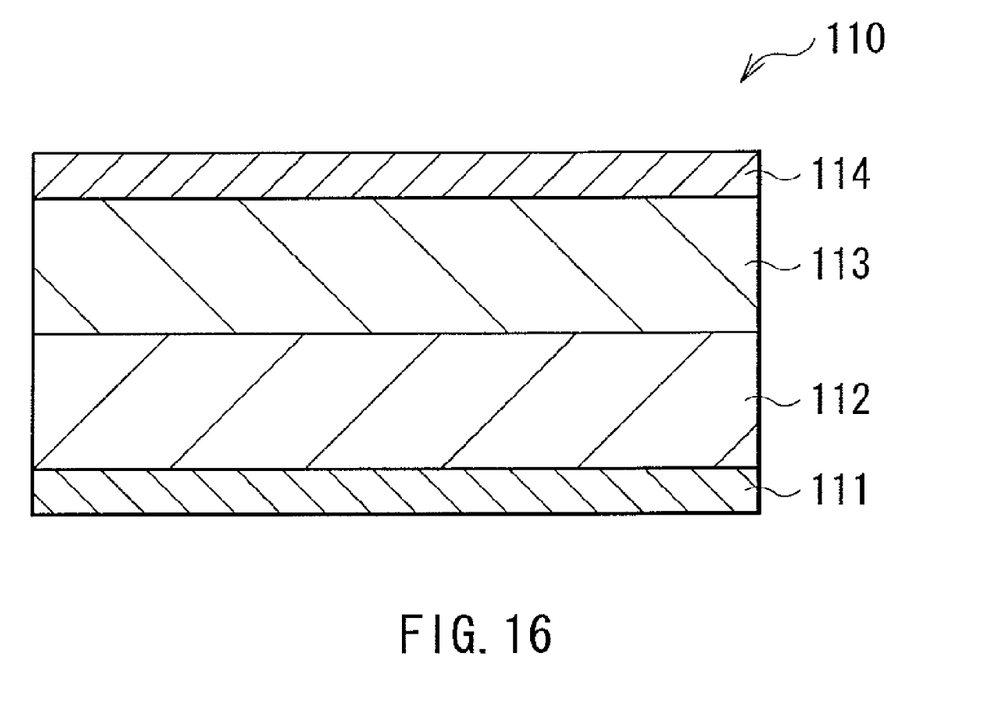
FIG. 16 is a cross sectional view illustrating a structure of the memory cell illustrated in FIG. 15.

Therefore, as a memory suitable for speeding up the data writing speed, a new type storage device as illustrated in FIG. 15 and FIG. 16 has been proposed.

FIG. 15 illustrates a memory cell 100 of the storage device. The memory cell 100 includes a variable resistive element 110 whose cross sectional structure is illustrated in FIG. 16 and an MOS transistor 120 (switching element). The variable resistive element 110 is formed by layering an electrode 111, an ion source layer 112, a high resistive layer 113, and an electrode 114. The electrode 111 is electrically connected to a bit line BLR, and the electrode 114 is electrically connected to one terminal of the MOS transistor 120, respectively. The other terminal of the MOS transistor 120 is electrically connected to a bit line BLT, and a gate of the MOS transistor 120 is electrically connected to a word line WL, respectively.

In the storage device, when a voltage is applied to the electrode 114 and the electrode 111 so that a current is flown from the ion source layer 112 to the high resistive layer 113, state of the high resistive layer 113 is changed to low resistance, and data is written. By contraries, when a voltage is applied to the electrode 114 and the electrode 111 so that a current is flown from the high resistive layer 113 to the ion source layer 112, state of the high resistive layer 113 is changed to high resistance, and data is erased.

Compared to the existing nonvolatile memory or the like, the storage device has features that no element size dependence exists since the memory cell is able to be structured by a simple structure, and the storage device is good at scaling since a large signal is able to be obtained. Further, the storage device has a large advantage that by controlling a recording current and a recording voltage, multiple values are able to be recorded, that is, 3 bit or more data is able to be stored in one memory cell (Patent document 1).

Nonpatent document 1: Nikkei Electronics, issue date: Jul. 16, 2007, p. 98

Patent document 1: Japanese Unexamined Patent Application Publication No. 2005-235360

However, for recording in the foregoing new type of storage device, it is necessary to properly adjust a resistance value level for every writing operation for every cell. Examples of techniques thereof include a method in which verification reading and rewriting are combined (hereinafter collectively and simply referred to as verification). That is, in such a method, verification reading is performed after writing operation. In the case of desired low resistance, it is determined that writing has succeeded and writing operation is finished. Meanwhile, in the case of high resistance exceeding the desired value, it is determined that writing has failed and rewriting is performed. Such a cycle is repeated until a certain upper limit number of cycles is completed. To obtain stable verification control, ability of adjusting the resistance value level should be improved.

In view of the foregoing problem, it is desirable to provide a storage device and an information rerecording method that improves ability of adjusting a resistance value level in recording and enables stable verification control.

SUMMARY

A storage device of an embodiment includes a plurality of memory cells having a storage element which has a pair of electrodes and on which information is recorded by applying a voltage to the electrodes, and a switching element that has a first input/output terminal, a second input/output terminal and a control terminal, in which the first input/output terminal is connected to one of the electrodes of the storage element. The storage device of the present invention includes a verification control means that checks whether or not information recording is correctly executed on the storage element, and performs rerecording according to a result thereof, and an electric potential difference change means that increases electric potential difference between the control terminal and the second input/output terminal of the switching element more than that in precedent recording in the rerecording by the verification control means.

Further, an information rerecording method of the present embodiment is a method of checking whether or not information recording is correctly executed on a storage element and performing rerecording according to a result thereof in a storage device including a plurality of memory cells having the storage element which has a pair of electrodes and on which information is recorded by applying a voltage to the electrodes, and a switching element that has a first input/output terminal, a second input/output terminal and a control terminal, in which the first input/output terminal is connected to one of the electrodes of the storage element. In the information rerecording method of the present embodiment, electric potential difference between the control terminal and the second input/output terminal of the switching element is increased more than that in precedent recording in the rerecording.

In the storage device and the information rerecording method of the present embodiment, whether or not the information recording is correctly executed on the storage element is checked and the rerecording is performed according to the result thereof by the verification control. The electric potential difference between the control terminal and the second input/output terminal of the switching element is increased more than that in precedent recording, and thereby the rerecording is surely performed.

In the storage device and the information rerecording method of the present embodiment, the verification control means may repeat a plurality of times of rerecording cycle, and the electric potential difference change means may vary an increase portion of the electric potential difference for every rerecording.

Further, it is desirable that the storage element is, for example, a nonvolatile variable resistive element in which a resistance value thereof is reversibly changed between high resistance state and low resistance state by applying voltages with different polarity between the electrodes, and the storage element is able to record multiple value information. In this case, it is desirable that the increase portion of the electric potential difference (step voltage) between the control terminal and the second input/output terminal of the switching element varies for every resistance value level of the multiple value information. Specifically, the increase portion of the electric potential difference varies according to magnitude relation of a variation range of the resistance value of the variable resistive element due to a current. More specifically, the increase portion of the electric potential difference is small in a region where the variation range of the resistance value of the variable resistive element due to the current is large, and the increase portion of the electric potential difference is large in a region where the variation range of the resistance value is small.

According to the storage device and the information rerecording method of the present embodiment, in the rerecording by the verification control, the electric potential difference between the control terminal and the second input/output terminal of the switching element is increased more than that in precedent recording. Thus, the rerecording is able to be surely performed, ability of adjusting the resistance value level is able to be improved, and stable verification control is able to be performed.

Further, in the case where the plurality of times of rerecording cycle are repeated, if the increase portion of the electric potential difference varies for every rerecording, the rerecording is able to be more surely performed. Further, in recording multiple values, the increase portion of the electric potential difference (step voltage) between the control terminal and the second input/output terminal of the switching element varies according to the multiple value information. Thereby, ability of adjusting the cell resistance value level is able to be improved, and necessary margin between each resistance value level is able to be sufficiently secured. Accordingly, more stable verification control is able to be performed.

Additional features and advantages are described herein, and will be apparent from, the following Detailed Description and the figures.

DETAILED DESCRIPTION

An embodiment will be hereinafter described in detail with reference to the drawings.

Figure 1:
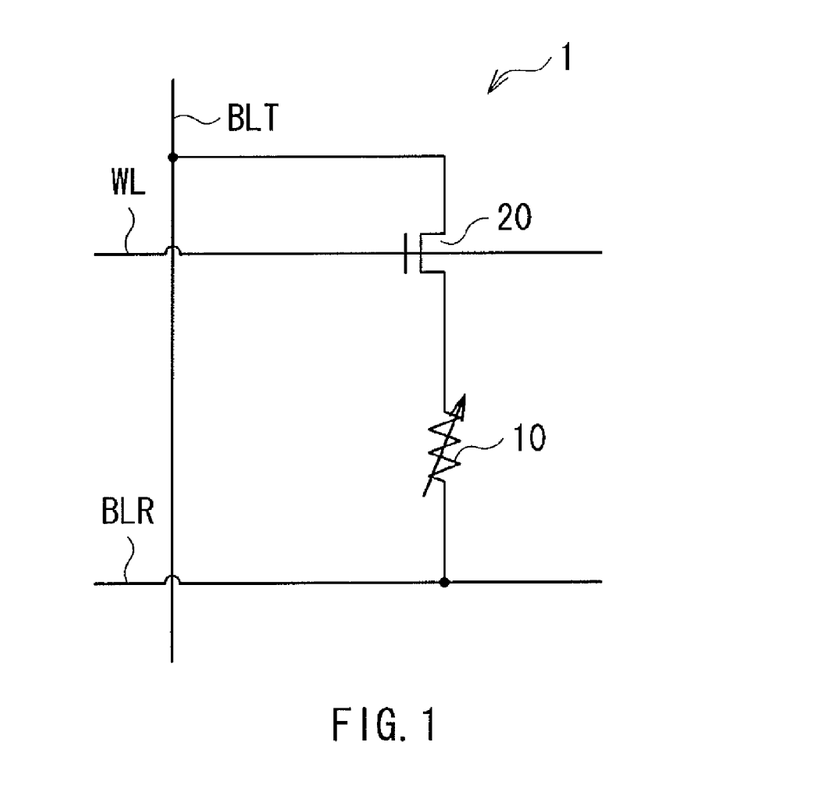
FIG. 1 is a circuit configuration diagram of a storage device (memory cell) according to an embodiment.
Figure 2:
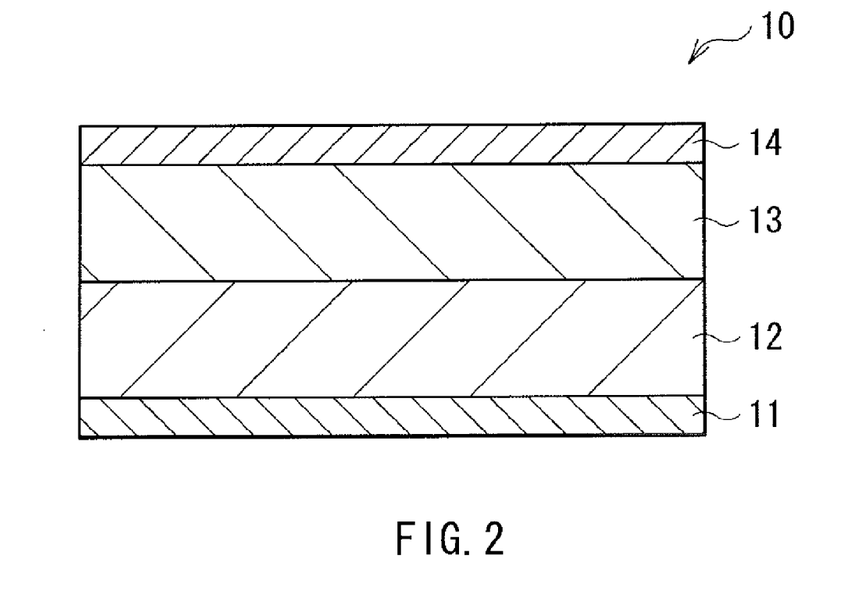
FIG. 2 is a cross sectional view illustrating a structure of the memory cell illustrated in FIG. 1.
Figure 3:
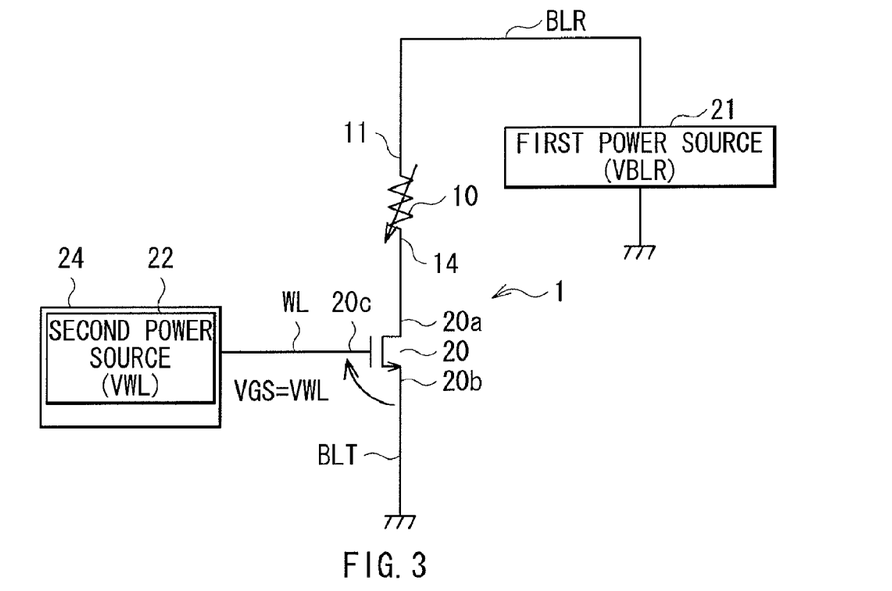
FIG. 3 is an equivalent circuit diagram at the time of information writing of the memory cell illustrated in FIG. 1.

FIG. 1 illustrates a memory cell 1 of a storage device according to an embodiment. The memory cell 1 includes a storage element such as a variable resistive element 10 illustrated in FIG. 2 and an N-channel MOS type transistor 20 as a switching element. In the storage device, a plurality of memory cells 1 as a storage unit are arranged in a state of array or in a state of matrix. FIG. 3 illustrates an equivalent circuit at the time of writing operation of the memory cell 1.

The variable resistive element 10 is formed, for example, by layering an electrode 11, an ion source layer 12, a high resistive layer (variable resistive layer) 13, and an electrode 14.

The electrodes 11 and 14 are made of a metal material such as Al, Cu, and W. The high resistive layer 13 is made of, for example, a metal material, a rear earth element, an oxide or a nitride composed of a mixture thereof, or a semiconductor material. The high resistive layer 13 has a function that the resistance value is changed according to the direction of electric field generated between the electrodes 11 and 14 by applying a voltage between the two electrodes 11 and 14 as will be described later.

The ion source layer 12 contains, for example, at least one kind of metal element out of Cu, Ag, and Al and at least one kind of chalcogen element out of Te, S, and Se. For example, the ion source layer 12 is composed of CuTeSi, GeSbTeSi, CuGeTeSi, AgGeTeSi, AgTeSi, AlTeSi, AlGeTeSi, ZrTeAl, CuZrTeAl, CuSSi, CuGeSSi, CuSeSi, CuGeSeSi or the like.

The foregoing Cu and the foregoing Ag are an element that is easily moved in the ion source layer 12 and the high resistive layer 13 in the case where Cu and Ag become a cation. Te is an element that is able to realize a smaller resistance value of the ion source layer 12 than a resistance value of the high resistive layer 13 when the variable resistive element 10 is turned on. Thus, in the case where Te is used as a chalcogen element in the ion source layer 12, a section where the resistance value is largely changed is able to be limited to the high resistive layer 13, and stability of memory operation is able to be improved. Further, in the case where Cu is used as an element to become a cation and Te is used as a chalcogen element in the ion source layer 12, the resistance value of the ion source layer 12 is able to be sufficiently smaller than the resistance value of the high resistive layer 13 when the variable resistive element 10 is turned on. Thus, in this case, stability of memory operation is able to be further improved.

Further, the foregoing Al is an element forming a chemically stable oxide when the state of the variable resistive element 10 is changed from low resistance to high resistance. Thereby, retention characteristics of erasing state (high resistance state) are improved. Si is an element capable of realizing the amorphous ion source layer 12 and increasing crystallization temperature of the ion source layer 12. Thus, in the case where an appropriate amount of Si is contained in the ion source layer 12, state change such as crystallization due to heat generated at the time of process or the like is inhibited, and stability of memory operation is able to be improved. The ion source layer 12 may further contain O (oxygen) such as TeAlZrOx. Thereby, retention characteristics at the time of writing data and controllability of resistance value are improved.

The electrode 11 of the variable resistive element 10 is electrically connected to the bit line BLR illustrated in FIG. 1, and the electrode 14 of the variable resistive element 10 is electrically connected to a first input/output terminal (drain/source) 20a of the transistor 20, respectively. A second input/output terminal (source/drain) 20b of the transistor 20 is electrically connected to the bit line BLT, and a control terminal 20c (gate terminal) of the transistor 20 is electrically connected to the word line WL, respectively.

A first pulse voltage (VBLR) is supplied from a first power source 21 through the bit line BLR to the electrode 11 of the variable resistive element 10. A second pulse voltage (VWL) for selecting a cell is supplied from a second power source 22 through the word line WL to the control terminal 20c of the transistor 20. The second input/output terminal 20b of the transistor 20 may be grounded (GND) through the bit line BLT (refer to FIG. 3). Otherwise, a third pulse voltage (VBLT) may be supplied from a third power source 23 to the second input/output terminal 20b of the transistor 20 (refer to FIG. 10).

Here, in this embodiment, in the first power source 21 and the third power source 23 (FIG. 10), each writing voltage value (pulse height) is a constant fixed voltage source, while in the second power source 22, the voltage value is able to be changed by an adjustment circuit 24 (adjustment means). That is, at the time of writing information, the voltage value applied to the control terminal 20c of the transistor 20 is able to be decreased or increased arbitrarily.

Specifically, for example, the second power source 22 includes a plurality of writing-use DC power sources with different voltage values (pulse height), in which selection thereof is made by the adjustment circuit 24. In addition, the pulse voltage is not limited to the voltage having literally pulse waveform, but includes a voltage having, for example, a lamp-shaped waveform.

In this embodiment, VWL supplied from the second power source 22 is able to be increased (increase portion ΔVWL) for every rerecording by after-mentioned verification control by the adjustment circuit 24. Further, in the case where the variable resistive element 10 is able to perform several stages of recording, that is, the variable resistive element 10 is able to record multiple value information at least in one state of high resistance state and low resistance state, as will be described later, ΔVWL becomes a value variable according to every resistance value level of the multiple value information. Specifically, ΔVWL is a value variable according to magnitude relation of variation width of recording resistance of the variable resistive element 10 due to a current. ΔVWL is a small value in a region where the variation width of the recording resistance due to a current is large (source-gate voltage VGS of the transistor 20 is small). Meanwhile, ΔVWL is a large value in a region where the variation width of the recording resistance is small (VGS is large). The first power source 21 to the third power source 23 and the WL adjustment circuit 24 described above configure a specific example of a verification control means and an electric potential difference change means of the present embodiment.

A description will be given of an operation of the storage device (memory cell 1) of this embodiment.

(Writing)

Negative electric potential (minus electric potential) is applied to the electrode 14 and positive electric potential (plus electric potential) is applied to the electrode 11 from the first power source 21 and the third power source 23, respectively, and thereby a current is flown from the ion source layer 12 to the high resistive layer 13. From the ion source layer 12, at least one kind of metal element out of Cu, Ag, and Zn is ionized, is diffused into the high resistive layer 13, is bonded to an electron and is precipitated on the electrode 14 side, or remains in a diffused state inside the high resistive layer 13. As a result, a current path containing large amounts of the foregoing metal element is formed inside the high resistive layer 13, or many defects due to the foregoing metal element are formed inside the high resistive layer 13, and the resistance value of the high resistive layer 13 is decreased. At this time, the resistance value of the ion source layer 12 is originally lower than the resistance value of the high resistive layer 13 before writing. Thus, as the resistance value of the high resistive layer 13 is decreased, the resistance value of the entire variable resistive element 10 is also decreased (that is, the variable resistive element 10 is turned on). In addition, the resistance of the entire variable resistive element 10 at this time becomes writing resistance. After that, when the electric potential applied to the electrodes 11 and 14 is set to zero, and the voltage applied to the variable resistive element 10 is set to zero, the resistance value of the variable resistive element 10 is kept low. As described above, writing of information is performed.

(Erasing)

Next, positive electric potential (plus electric potential) is applied to the electrode 14 and negative electric potential (minus electric potential) is applied to the electrode 11 from the first power source 21 and the third power source 23, respectively, and thereby a current is flown from the high resistive layer 13 to the ion source layer 12. The current path formed in the high resistive layer 13 or the foregoing metal element composing impurity level is ionized, which is moved in the high resistive layer 13 and is returned to the ion source layer 12 side. In the result, the current path or the defects disappear from inside of the high resistive layer 13, and the resistance value of the high resistive layer 13 is increased. At this time, the resistance value of the ion source layer 12 is originally low. Thus, as the resistance value of the high resistive layer 13 is increased, the resistance value of the entire variable resistive element 10 is also increased (that is, the variable resistive element 10 is turned off). The resistance of the entire variable resistive element 10 at this time becomes erasing resistance. After that, when the electric potential applied to the electrodes 11 and 14 is set to zero, and the voltage applied to the variable resistive element 10 is set to zero, the resistance value of the variable resistive element 10 is kept high. As described above, the written information is erased.

By repeating the foregoing steps, writing information into the variable resistive element 10 and erasing the written information are able to be repeatedly performed.

At this time, for example, in the case where the state in which the resistance of the entire variable resistive element 10 is writing resistance (low resistance state) corresponds to information "1," and the state in which the resistance of the entire variable resistive element 10 is erasing resistance (high resistance state) corresponds to information "0," the information of the variable resistive element 10 is able to be changed from "0" to "1" by applying negative electric potential to the electrode 14, and the information of the variable resistive element 10 is able to be changed from "1" to "0" by applying positive electric potential to the electrode 14.

Further, in the variable resistive element 10, a wide range of resistance value is able to be retained. By controlling the current amount flown into the cell, current path size is able to be limited. Thus, at least in one state of high resistance state and low resistance state, several steps of current path size are able to be formed, and such a state is able to be stably retained. Accordingly, by associating a plurality of resistance value levels corresponding to each current path size with information, multiple (three or more) value recording is enabled, and a large capacity is able to be realized.

For example, in the case where the state in which the writing resistance of the variable resistive element 10 is lowest corresponds to "11," the state in which the writing resistance of the variable resistive element 10 is secondly lowest corresponds to "10," the state in which the writing resistance of the variable resistive element 10 is thirdly lowest corresponds to "01," and erasing state of the variable resistive element 10 corresponds to "00," respectively, the information of the variable resistive element 10 is able to be changed to direction where the resistance of the variable resistive element 10 becomes lower such as from "00" to "01," from "01" to "11," and from "10" to "11" by applying negative electric potential to the electrode 14, and concurrently controlling a current flown through the variable resistive element 10. Similarly, information of the variable resistive element 10 is able to be returned from "01", "10," or "11" to "00" by applying positive electric potential to the electrode 14.

(Reading)

In the case where the information recorded as described above is read, negative electric potential is applied to the electrode 14 to the degree with which writing operation is not generated, and positive electric potential is applied to the electrode 11. Otherwise, by contraries, positive electric potential is applied to the electrode 14 to the degree with which erasing operation is not generated, and negative electric potential is applied to the electrode 11. Thereby, a current is flown to the ion source layer 12 and the high resistive layer 13. In the result, a slight current corresponding to the resistance value in writing state and the resistance value in erasing state is flown. The current value is detected by a sense amplifier or the like arranged, for example, outside a memory cell array. Thereby, whether the variable resistance element 10 is in low resistance state ("1") or high resistance state ("0") is able to be determined. The same is applied to a case of multiple value recording.

As described above, the variable resistance element 10 of this embodiment has a simple structure in which the electrode 11, the ion source layer 12, the high resistive layer 13, and the electrode 14 are only layered. Thus, even in the case of miniaturization, information is able to be written and erased. In addition, even without supplying electric power, the resistance value of the high resistive layer 13 is able to be retained. Thus, information is able to be retained for a long time. Further, the resistance value of the high resistive layer 13 is not changed by reading, and it is not necessary to perform refresh operation, and thus power consumption is able to be decreased by just that much.

(Verification)

As described above, in verification operation, after writing operation, reading (verification reading) is performed. If state of the variable resistance element 10 is low resistance, it is determined that writing has succeeded, and writing operation is finished. Meanwhile, if state of the variable resistance element 10 is high resistance, it is determined that writing has failed, and rewriting is performed. Such a cycle is repeated until a certain upper limit number of cycles is completed.

In the equivalent circuit of FIG. 3, the bit line BLT is grounded, and thereby the current flown through the variable resistance element 10 is controlled by only VWL by the WL adjustment circuit 24. At this time, the cell applied current is as follows.

$$\text{Cell applied current} \approx 1/2 \cdot W/L \ \mu s Cox$$
$$(Vg-Vs-Vt)^2 = 1/2 \cdot W/L \ \mu s Cox$$
$$(VWL-Vt)^2 \quad \text{[Mathematical formula 1]}$$

where W represents a channel width, L represents a channel length, μs represents carrier surface mobility, Cox represents a gate capacity per unit area, Vg represents a gate voltage, Vs (=0V) represents a source voltage, Vt represents a threshold voltage, and VWL represents a word line voltage, respectively.

Adjustment of the writing current at the time of the foregoing verification is made mainly by the electric potential difference VGS between the gate and the source of the transistor 20 based on the foregoing current formula. Specifically, control is exercised by the word line voltage VWL. If writing fails, it is necessary to perform rewriting. In this embodiment, VGS (VWL) is increased than in the precedent writing to improve writing success rate.

Figure 4:
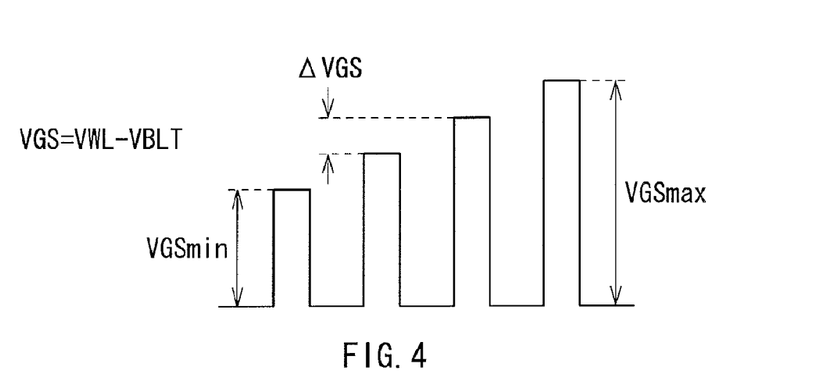
FIG. 4 is a waveform chart for explaining verification control.

FIG. 4 schematically illustrates the foregoing verification control. This is an example of verification performed under the conditions in which VGSmin is the initial value, the number of upper limit of cycles is four, and voltage upper limit is VGSmax. The voltage is increased by ΔVGS every time. In the figure, verification reading is not illustrated. Verification reading is inserted after applying voltage pulse.

In addition, in FIG. 4, the increase portion ΔVGS is the identical value for each cycle. However, as ΔVGS1, ΔVGS2, ΔVGS3 and the like illustrated in FIG. 5, ΔVGS may be sequentially increased for every cycle.

By the way, the foregoing verification control is effective in the case where resistance change of the memory cell is linear. However, in the case where the resistance change is nonlinear and multiple value recording is performed, the increase portion ΔVGS of VGS is desirably changed for every resistance value level of the multiple value information. The reason thereof will be described below.

Figure 6:
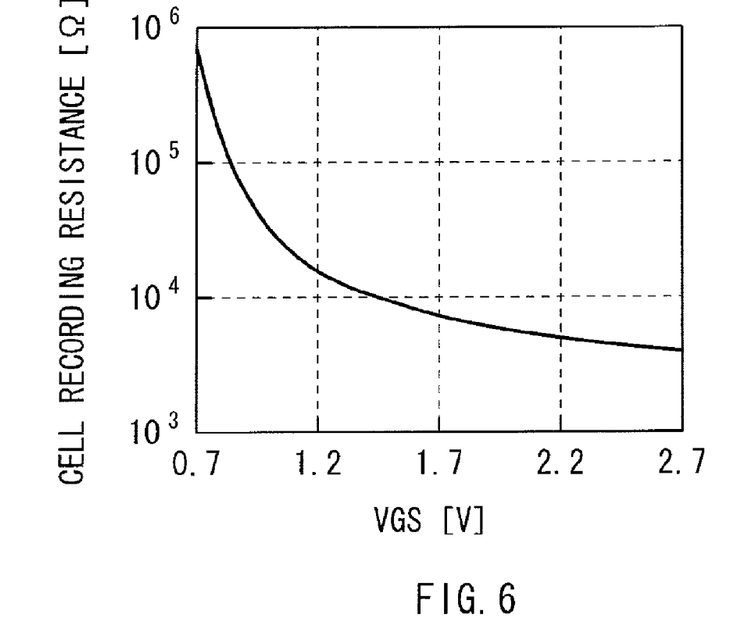
FIG. 6 illustrates VGS-cell recoding resistance characteristics of the memory cell.
Figure 7:
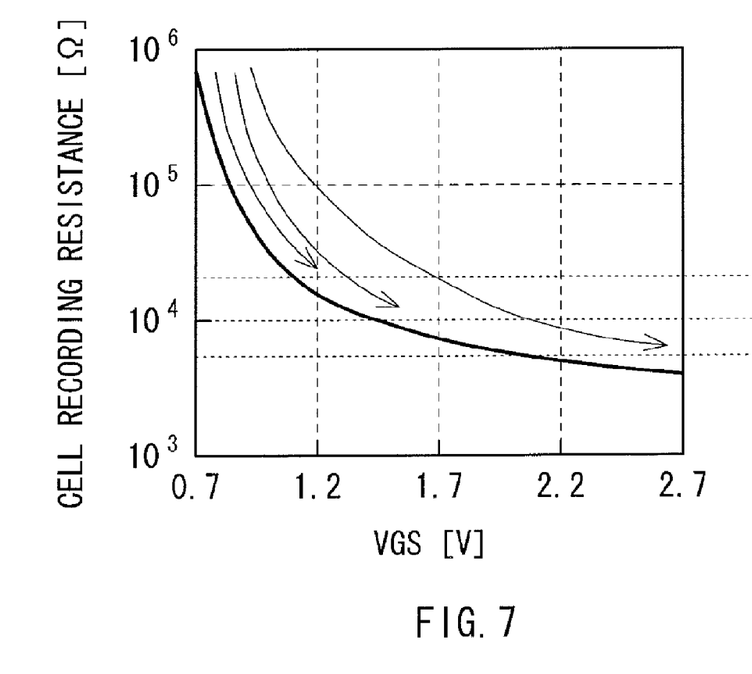
FIG. 7 is a diagram for explaining transition state of a resistance value.

FIG. 6 illustrates an example of relation between the foregoing VGS and cell recording resistance. As an example of multiple value recording, in the case of 2 bit/cell, that is, in the case of multiple value memory of 4 values/cell, as illustrated in FIG. 4 (schematic verification waveform) and FIG. 7 (transition state of resistance value), it is necessary to adjust the foregoing verification operation while stepping up or stepping down VGS until a desired resistance value level is obtained. However, the relation between VGS and the cell recording resistance is not always linear as illustrated in FIG.

6. If the step amount is identical, according to the desired multiple value level, phenomenon that the resistance value goes over the expected level by verification, resulting in inability to secure necessary margin between each level. In this case, it is desirable to perform the following verification control.

Figure 8:
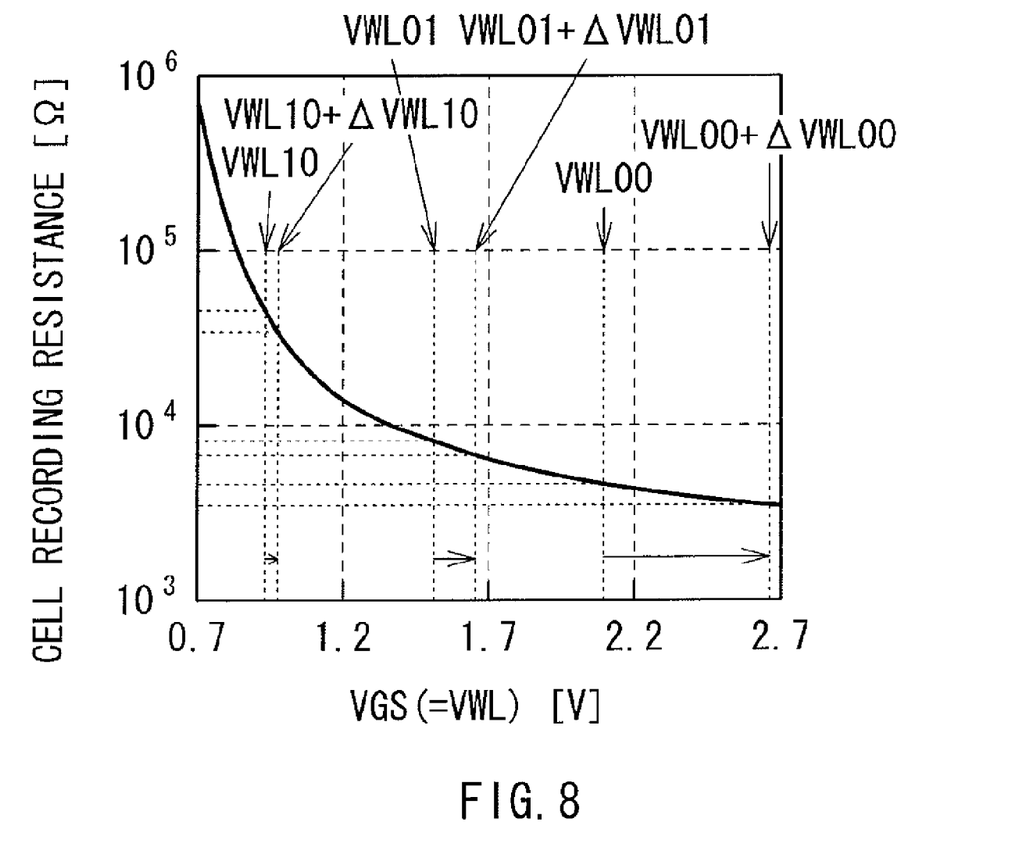
FIG. 8 is a diagram for explaining a variation range of cell recording resistance to magnitude of VGS.

FIG. 8 illustrates variation range of the cell recording resistance of VGS (=VWL)–cell recording resistance characteristics of the recoding cell in this embodiment. According to FIG. 8, it is found that in the region where the recording current is small, that is, VGS is small, as the variation range of the cell recording resistance becomes larger and the recording current becomes larger, that is, as VGS becomes larger, the variation range of the cell recording resistance becomes smaller gradually. Therefore, for performing multiple value recording in the cell having such characteristics, in the region where the variation range of the recording resistance is large (VGS is small), the VGS step voltage ΔVGS in verification is set smaller than other step voltage set value, while in the region where the variation range of the recording resistance is small (VGS is large), the VGS step voltage ΔVGS in verification is set larger than other step voltage set value. That is, it is effective to set the step voltage corresponding to magnitude relation of the variation range of the recording resistance (corresponding to the slope of FIG. 8).

Figure 9:
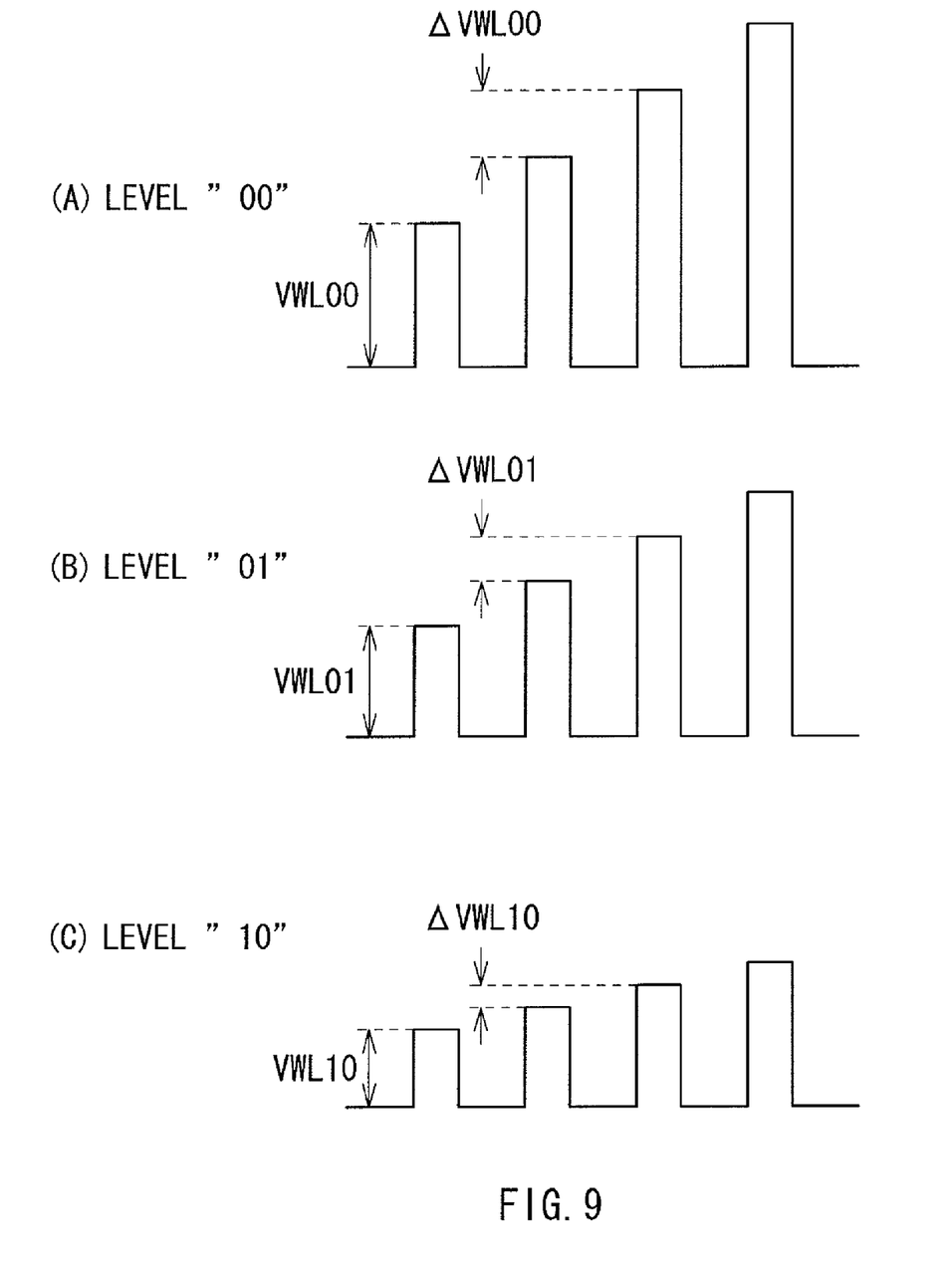
FIG. 9 is a waveform chart for explaining verification control in multiple value recording.

FIGS. 9(A) to 9(C) illustrate a schematic view of verification control according to the resistance value level of the multiple value information as described above. This is an example in which 3 values are recorded on the writing side for realizing 3 values on the writing side and realizing the remaining 1 value on the erasing side out of 2 bit/cell, that is, 4 values/cell. In all FIGS. 9(A) to 9(C), after writing operation, verification reading is performed. In the case of low resistance, it is determined that writing has succeeded, and writing operation is finished. Meanwhile, in the case of high resistance, it is determined that writing has failed, and rewriting is performed. Such a cycle is repeated until a certain upper limit number of cycles is completed. In the case where rewriting is performed, VGS (VWL) is increased than in the precedent writing and thereby writing current is increased to improve writing success rate.

In this embodiment, in the case where the information "00" corresponding to the lowest resistance value level is recorded, step voltage ΔVWL00 larger than other information is set as illustrated in FIG. 9(A). In the case where the information "10" corresponding to the highest resistance value level is recorded, step voltage ΔVWL10 smaller than other information is set as illustrated in FIG. 9(C). In the case where the intermediate resistance value level "01" between the information "00" and the information "10" is recorded, step voltage ΔVWL01 between the step voltage ΔVWL00 and the ΔVWL10 is set as illustrated in FIG. 9(B).

As described above, in this embodiment, in rerecording, the gate-source voltage VGS of the transistor 20 is increased than in the precedent writing. Thus, rerecording is able to be surely performed.

Further, in repeating a plurality of times of rerecording cycles, the step voltage ΔVGS is increased for every rerecording. Thus, rerecording is able to be more surely performed. Further, in multiple value recording, by changing ΔVGS according to the multiple value information, adjustment ability of the cell resistance value level is improved, and necessary margin between each resistance value level is able to be secured.

Figure 5:
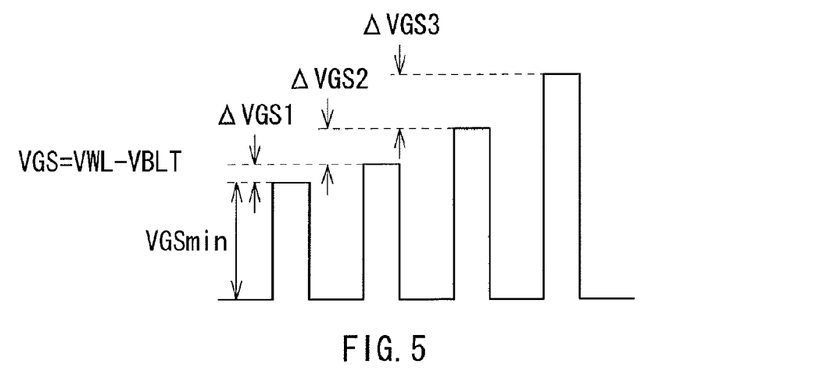
FIG. 5 is a waveform chart for explaining another verification control.
Figure 14:
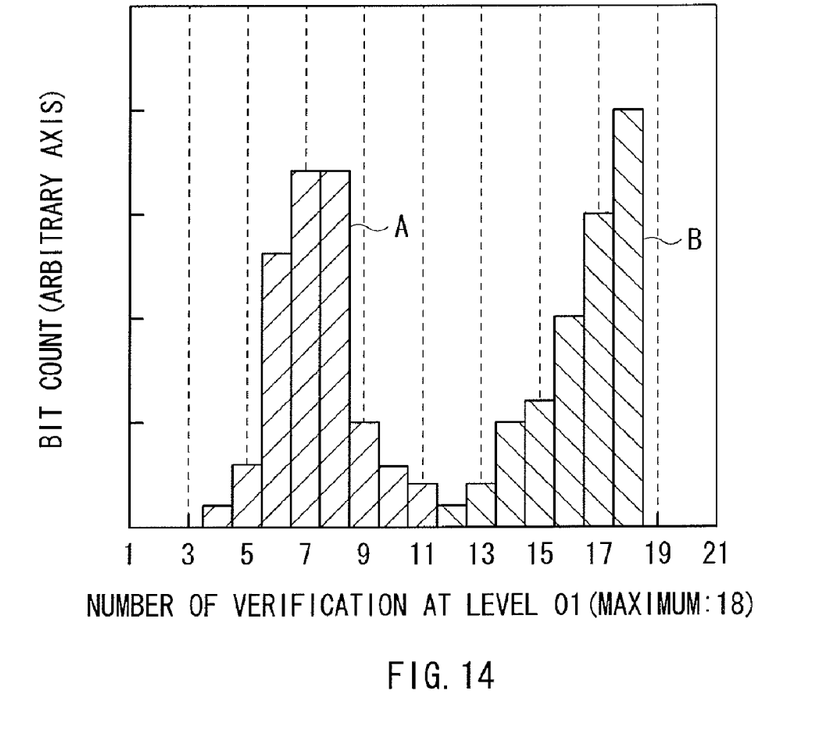
FIG. 14 illustrates a relation between the number of verification at level 01 of FIG. 5(B) and bit count.

In addition, FIG. 14 illustrates a relation between the number of verification (maximum: 18) at the level 01 of FIG. 5(B) and bit count. In the figure, A represents a result of a case that verification is performed while stepping up VWL as in the foregoing embodiment, and B represents a result of a case that verification is performed without stepping up VWL. In the result, it is found that by stepping up VWL, the number of verification is able to be largely decreased. That is, recording of information is facilitated.

Figure 10:
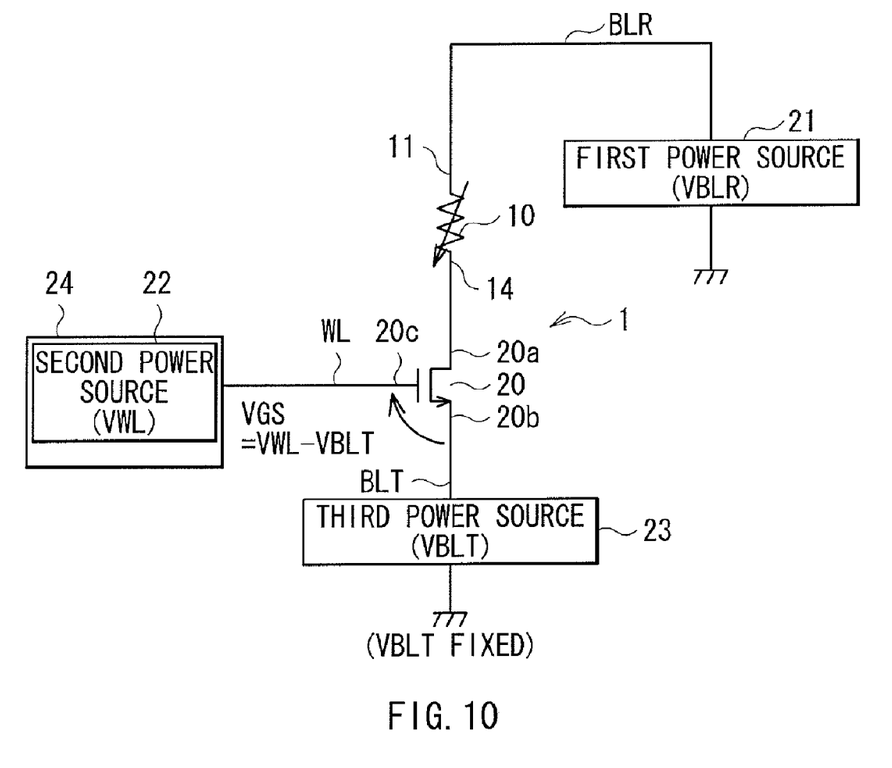
FIG. 10 is an equivalent circuit diagram at the time of information writing of a memory cell according to a modified example.
Figure 11:
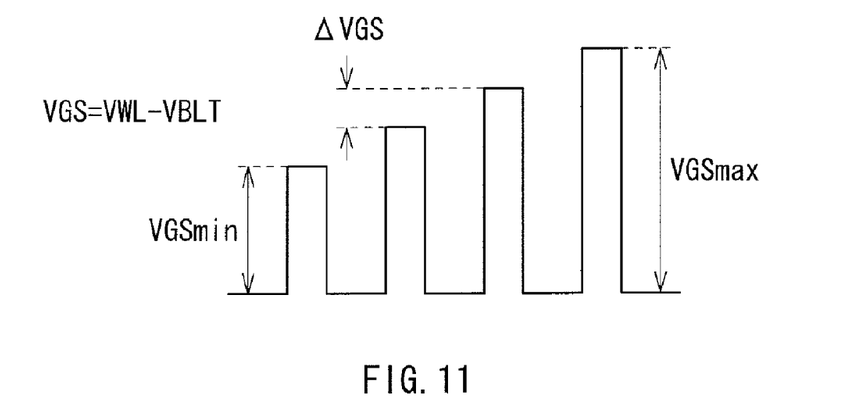
FIG. 11 is a waveform chart for explaining verification control in the circuit of FIG. 10.

In addition, while in the foregoing embodiment, the description has been given on the presumption that the bit line BLT is grounded for simplicity, the present invention is not limited thereto. In the case where a fixed voltage VBLT (bit line voltage) is supplied from the third power source 23 to the bit line BLT as illustrated in FIG. 10, verification control is performed under the conditions of VGS=VWL−VBLT as illustrated in FIG. 11. At this time, the cell applied current is as follows, and the other points are similar to those of the foregoing embodiment.

$$\text{Cell applied current} \approx \tfrac{1}{2} \cdot W/L\ \mu sCox(Vg-Vs-Vt)^2 = \tfrac{1}{2} \cdot W/L\ \mu sCox(VWL-VBLT-Vt)^2 \quad \text{[Mathematical formula 2]}$$

Figure 12:
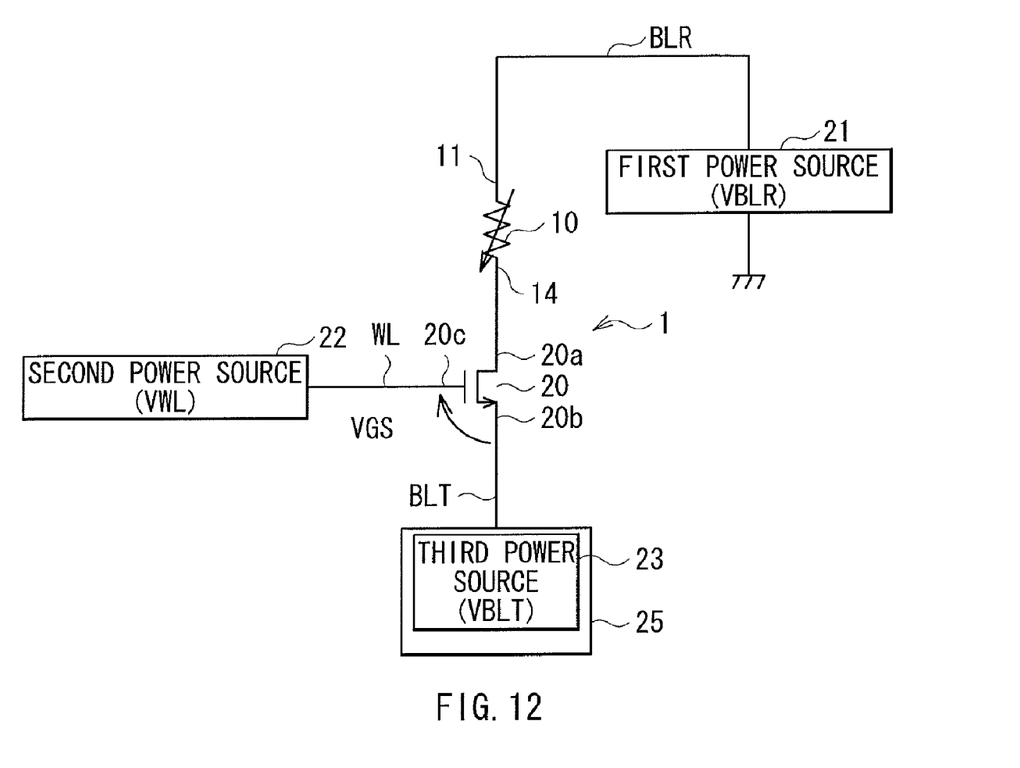
FIG. 12 is an equivalent circuit diagram at the time of information writing of a memory cell according to another modified example.
Figure 13:
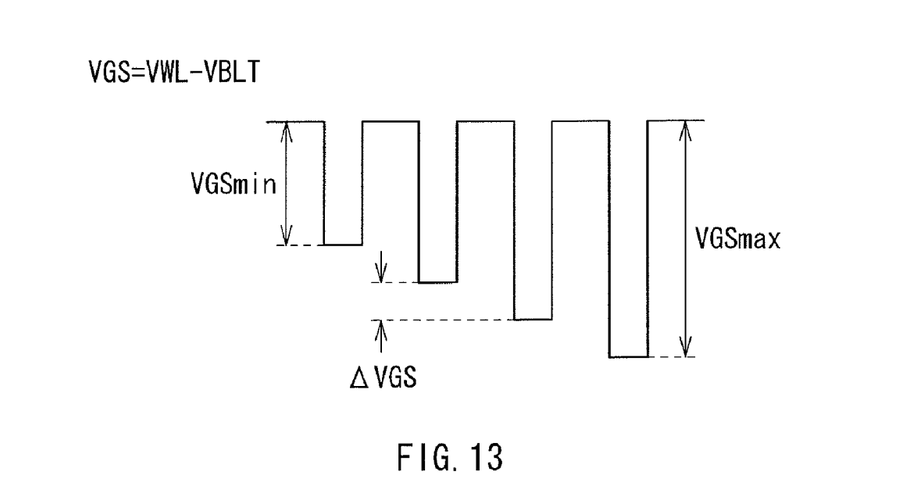
FIG. 13 is a waveform chart for explaining verification control in the circuit of FIG. 12.

In the foregoing embodiment, the current flown through the variable resistance element 10 is controlled by only VWL by the WL adjustment circuit 24. However, as illustrated in FIG. 12 and FIG. 13, it is possible that VWL is a constant value, VBLT of the third power source 23 is able to be changed by an adjustment circuit 25, and thereby VGS (=VWL−VBLT) is able to be changed. Further, in the foregoing embodiment, the description has been given of the verification control. However, the embodiment is applicable to not only the verification control, but also individual control of a writing voltage.

Further, in the foregoing embodiment, the description has been given of the memory cell (so-called 1T-1R type memory cell) in which one variable resistive element 10 is connected to one selected transistor as an example. However, the embodiment is able to be applied to a memory cell in which a plurality of variable resistive elements 10 are connected to one selected transistor.

Further, the structure of the variable resistive element 10 is not limited to the structure of the foregoing embodiments. Other structure such as a structure in which lamination order of the ion source layer 12 and the high resistive layer 13 is reversed in the cross sectional structure of FIG. 2, a structure in which instead of providing the ion source layer 12, the metal element used for the ion source layer 12 is contained in the high resistive layer 13, and a structure in which the metal element used for the ion source layer 12 is contained in an electrode and the electrode also functions as the ion source layer 12 may be used. The present invention is applicable to any storage device using such a variable resistive element. Further, the storage element is not limited to the foregoing variable resistive element, but other element such as a phase-change memory is able to be used. A storage device using such a memory may be configured.

Further, as a switching element, though the NMOS transistor 20 is used, a PMOS transistor may be used. Further, any switching element having two input/output terminals and a control terminal may be used as a switching element of the embodiment. In addition to the MOS transistor, a bipolar transistor may be used.

It should be understood that various changes and modifications to the presently preferred embodiments described herein will be apparent to those skilled in the art. Such changes and modifications can be made without departing from the spirit and scope of the present invention and without diminishing its intended advantages. It is therefore intended that such changes and modifications be covered by the appended claims.

The invention claimed is:

1. A storage device comprising:
    a plurality of memory cells having a storage element which has a pair of electrodes and on which information is recorded by applying a voltage to the electrodes;
    and a switching element that has a first input/output terminal, a second input/output terminal and a control terminal, in which the first input/output terminal is connected to one of the electrodes of the storage element;
    a verification control means that checks whether or not information recording is correctly executed on the storage element, and performs rerecording according to a result thereof; and
    an electric potential difference change means that increases electric potential difference between the control terminal and the second input/output terminal of the switching element more than that in precedent recording in the rerecording by the verification control means.

2. The storage device according to claim 1, wherein the verification control means repeats a plurality of times of rerecording cycle, and
    the electric potential difference change means varies an increase portion of the electric potential difference for every rerecording.

3. The storage device according to claim 1, wherein the storage element is a nonvolatile variable resistive element in which a resistance value thereof is reversibly changed between high resistance state and low resistance state by applying voltages with different polarity between the electrodes.

4. The storage device according to claim 3, wherein the storage element is able to record multiple value information, and
    the electric potential difference change means varies the increase portion of the electric potential difference for every resistance value level of the multiple value information.

5. The storage device according to claim 4, wherein the electric potential difference change means varies the increase portion of the electric potential difference according to magnitude relation of a variation range of the resistance value of the variable resistive element due to a current.

6. The storage device according to claim 5, wherein in the electric potential difference change means, the increase portion of the electric potential difference is small in a region where the variation range of the resistance value of the variable resistive element due to the current is large, and the increase portion of the electric potential difference is large in a region where the variation range of the resistance value of the variable resistive element due to the current is small.

7. The storage device according to claim 1, wherein the electric potential difference change means increases the electric potential difference by changing a voltage applied to the control terminal of the switching element.

8. The storage device according to claim 1, wherein the electric potential difference change means increases the electric potential difference by changing a voltage applied to the second input/output terminal of the switching element.

9. The storage device according to claim 7, wherein the switching element is an MOS transistor, and the electric potential difference change means changes a gate-source voltage of the MOS transistor.

10. The storage device according to claim 2, wherein the storage element further has a high resistive layer and an ion source layer being contacted with the high resistive layer and containing a metal element that is easily ionized, between the electrodes.

11. The storage device according to claim 2, wherein the storage element has a high resistive layer between the electrodes, and a metal element that is easily ionized is contained in the high resistive layer.

12. The storage device according to claim 10, wherein the metal element is at least one element selected from the group consisting of Cu, Ag, and Al.

13. The storage device according to claim 10, wherein at least one element selected from the group consisting of S, Se, Te, and O is contained in a layer contacted with the high resistive layer or in the high resistive layer.

14. The storage device according to claim 10, wherein when a first pulse voltage is applied between the electrodes, the ionized metal element is moved from the ion source layer into the high resistive layer, and thereby resistance of the storage element is decreased.

15. An information rerecording method comprising:
    checking whether or not information recording is correctly executed on a storage element; and
    performing rerecording according to a result thereof in a storage device,
    the storage device including a plurality of memory cells having the storage element which has a pair of electrodes and on which information is recorded by applying a voltage to the electrodes and a switching element that has a first input/output terminal, a second input/output terminal and a control terminal, in which the first input/output terminal is connected to one of the electrodes of the storage element, wherein
    electric potential difference between the control terminal and the second input/output terminal of the switching element is increased more than that in precedent recording in the rerecording.

16. The information rerecording method according to claim 15, wherein the storage element is a nonvolatile variable resistive element in which a resistance value thereof is reversibly changed between high resistance state and low resistance state by applying pulse voltages with different polarity between the electrodes.

17. The information rerecording method according to claim 15, further comprising repeating a rerecording cycle a plurality of times, and
    an increase portion of the electric potential difference varies for every rerecording.

18. The information rerecording method according to claim 16, wherein the storage element is able to record multiple value information, and
    an increase portion of the electric potential difference varies for every resistance value level of the multiple value information.

* * * * *